United States Patent
Cheng et al.

(10) Patent No.: US 6,833,233 B2
(45) Date of Patent: Dec. 21, 2004

(54) DEEP UV-RESISTANT PHOTORESIST PLUG FOR VIA HOLE

(75) Inventors: Chung-Hsiu Cheng, Banchiau (TW); Pin-Yi Hsin, Hsin-Chu (TW); Ming-Chyi Liu, Hsin-Chu (TW); Chih-Hsien Hsu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 98 days.

(21) Appl. No.: 10/133,613

(22) Filed: Apr. 26, 2002

(65) Prior Publication Data

US 2003/0201543 A1 Oct. 30, 2003

(51) Int. Cl.[7] .................................................. G03F 7/26
(52) U.S. Cl. ....................................... 430/315; 430/311
(58) Field of Search ................................ 430/311, 313, 430/315, 322, 324

(56) References Cited

U.S. PATENT DOCUMENTS 6,211,068 B1 * 4/2001 Huang ......................... 438/634
6,469,775 B1 * 10/2002 Holscher ....................... 355/71

* cited by examiner

Primary Examiner—Kathleen Duda
(74) Attorney, Agent, or Firm—Tung & Associates

(57) ABSTRACT

A deep ultraviolet (UV) light-resistant photoresist plug for via holes, as may be used in damascene, dual-damascene, and other types of semiconductor fabrication processing, is disclosed. A via hole of a semiconductor wafer is partially plugged with non-photosensitive photoresist, such as negative photoresist. The via hole and the wafer are then coated with a deep UV light-sensitive photoresist. The deep UV light-sensitive photoresist is exposed to deep UV light, such as 193 nanometer (nm) wavelength light, where the non-photosensitive photoresist is unresponsive to the deep UV light. The wafer is then developed to selectively remove the deep UV light-sensitive photoresist, where the non-photosensitive photoresist substantially remains.

8 Claims, 4 Drawing Sheets

DEEP UV-RESISTANT PHOTORESIST PLUG FOR VIA HOLE

FIELD OF THE INVENTION

This invention relates generally to semiconductor device fabrication, and more particularly to plugging via holes, such as for damascene and dual-damascene processing performed during such fabrication.

BACKGROUND OF THE INVENTION

Since the invention of the integrated circuit (IC) semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Photolithography is commonly characterized by the wavelength of the light used to imprint images on semiconductor wafers through reticles or masks. The smaller the wavelength used, the higher the resolution of the resulting semiconductor device features. Traditional lithography used 436 nanometer (nm) wavelengths, and more current conventional lithography uses 365 nm wavelengths. Both of these wavelengths are typically generated by using a high-pressure mercury bulb. Emission spectrum from the light produced by the bulb contains lines, which are intensity peaks at certain frequencies, that can be selected by optical filters. 436 nm wavelengths are also referred to as g-line wavelengths, and 365 nm wavelengths are also referred to as i-line wavelengths, resulting from the lines producing the appropriate wavelength of light. Other wavelengths that have been used include 405 nm, or h-line, and 546 nm, or e-line. H- and i-line wavelengths are near-ultraviolet (UV) wavelengths, whereas g- and e-line wavelengths are still in the visible light spectrum.

Deeper UV wavelengths, at the mid-UV level, have been achieved by using mercury xenon bulbs. Such bulbs produce strong emissions at 290 nm, and weaker emissions at 280, 265, and 248 nm. Furthermore, so-called deep UV wavelengths are achieved by using lasers, due to the higher intensity required. 193 nm wavelengths are in particular produced by argon fluoride lasers, and thus lithography using 193 nm wavelengths is referred to as ArF lithography. 248 nm wavelengths, which are also considered deep UV wavelengths, are generated by krypton fluoride lasers, and therefore lithography using 248 nm wavelengths is referred to as KrF lithography. Another type of deep UV wavelengths is the 222 nm wavelength, generated by krypton chloride lasers, and lithography using 222 nm wavelengths is referred to as KrCl lithography.

Different types of photoresists respond to different wavelengths of light. As a result, photoresists are also generally characterized by the wavelengths of light to which they respond. For example, there is g-line photoresist and i-line photoresist, as well as 193 nm photoresist and 248 nm photoresist. For a given wavelength of light being used, an appropriate photoresist is conventionally selected to achieve proper feature definition in the semiconductor devices being fabricated.

Via holes are semiconductor device features that are through holes made in a substrate, for a variety of different purposes. Via holes may be used to ground semiconductor devices and passive devices. Via holes may be made through dielectric layers, for subsequent metal deposition to form a plug and create an interconnect between two metal lines. Multi-level interconnect schemes may employ such via holes. Processes used to perform such interconnection using via holes include the damascene process and the dual-damascene process.

In the damascene process, interconnect metal lines are delineated in dielectrics, isolating them from each other using chemical mechanical planarization (CMP) in lieu of lithography and etching. The interconnect pattern is first lithographically defined in the dielectric layer, and then metal is deposited to fill the resulting trenches. Excess metal is removed by CMP. The dual-damascene process is a modified version of the damascene process, and is also used to form metal interconnect geometries using CMP instead of metal etching. In the dual-damascene process, two inter-layer dielectric patterning steps and one CMP step creates the pattern that would require two patterning steps and two metal CMP steps if the conventional damascene process were instead used.

Thus, the fundamental difference of damascene processing relative to standard processing is that metal lines are not etched, but deposited in grooves within the dielectric layer, and excess metal is removed by CMP. Both damascene process are considered the future technology of choice for laying metal lines and interconnects on semiconductor devices. The damascene process is commonplace for 0.18–0.13 micron technology, whereas the dual-damascene process is more common for 0.13–0.10 micron technology.

A problem with damascene and dual-damascene processes as currently employed is that the photoresist used to plug the via hole may nevertheless be responsive to deep UV exposure during subsequent lithographic processing, such as 193 nm lithography. The exposure and subsequent removal of the photoresist plug during development can cause later facet growth during trench etching, which is undesirable. Furthermore, the sensitivity of the i-line photoresist to deep UV light during deep UV lithography can damage the i-line photoresist, causing problems during subsequent semiconductor fabrication processing. This is also undesirable, and can be costly to the semiconductor manufacturer.

FIGS. 1A and 1B show an extreme case of such plug removal. In FIG. 1A, there is, in order from bottom to top, an inter-metallization dielectric layer 102, a first silicon nitride stop layer 104, a first dielectric layer 106 (such as fluoride-doped silicate glass, or FSG) a second silicon nitride stop layer 108, a second dielectric layer 110 (also such as FSG), and a final layer 112. There is also a copper layer 114, as well as an i-line photoresist plug 116, and a deep UV photoresist coating 118. The deep UV photoresist coating 118 is exposed to a deep UV light source, such as 193 nm wavelengths, as indicated by the lines 120, and is developed to remove selectively the coating 118.

This results in FIG. 1B, where a large portion of the coating 118 has been removed, especially within the trench 122. However, the photoresist plug 116 has also been removed from where it should be, a level indicated by the dotted line 224. This is because the i-line photoresist plug 116 is still sensitive to the deep UV light. Note that FIG. 1B represents the worst case scenario, where the entire plug 116 has responded to the deep UV light and is thus removed during development. However, even in less than worst case scenarios, a substantial part of the plug 116 may be removed, such that it does not rise to the level of the dotted line 224 as it should. This is also deleterious, and can cause the undesired effects that have been described.

Therefore, there is a need for a photoresist plug for damascene, dual-damascene, and other types of semiconductor fabrication processing that does not respond to deep UV light, such as 193 nm wavelengths. Such a photoresist plug should be resistant to damage during deep UV lithography. Such a photoresist plug should also decrease the chance of facet formation during subsequent trench fabrication. For these and other reasons, there is a need for the present invention.

SUMMARY OF THE INVENTION

The invention relates to a deep ultraviolet (UV) light-resistant photoresist plug for via holes, as may be used in damascene, dual-damascene, and other types of semiconductor fabrication processing. A method of the invention first partially plugs a via hole of a semiconductor wafer with non-photosensitive photoresist, such as negative photoresist. The via hole and the wafer are then coated with a deep UV light-sensitive photoresist. The deep UV light-sensitive photoresist is exposed to deep UV light, such as 193 nanometer (nm) wavelength light, where the non-photosensitive photoresist is unresponsive to the deep UV light. The wafer is then developed to selectively remove the deep UV light-sensitive photoresist, where the non-photosensitive photoresist substantially remains.

Embodiments of the invention provide for advantages over the prior art. The deep UV light-sensitive photoresist and the non-photosensitive photoresist are selectively different. Therefore, when the wafer is exposed to the deep UV light, the non-photosensitive photoresist plug is unaffected, such that during subsequent development, substantially the entire photoresist plug remains. Such a photoresist plug is thus resistant to damage during deep UV photolithography, and substantially prevents facet formation during subsequent semiconductor fabrication processing. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

The invention uses a non-photosensitive photoresist plug in a via hole in damascene, dual-damascene, and other types of semiconductor processing. An example of using such a plug in conjunction with dual-damascene processing is described with reference to FIGS. 2A–2G. FIGS. 2A–2G show a semiconductor device being formed on a semiconductor wafer, where the semiconductor device can be such a device according to an embodiment of the invention in an initial, interim, or final processing stage.

Figure 1A:
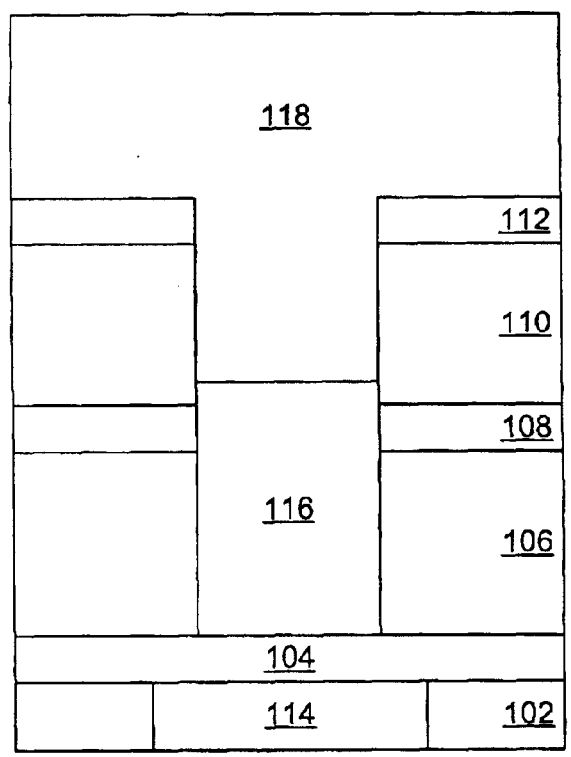
FIGS. 1A and 1B are diagrams showing the undesirable result of i-line photoresist plug removal that can result during damascene, dual-damascene, and other semiconductor fabrication processing.
Figure 1B:
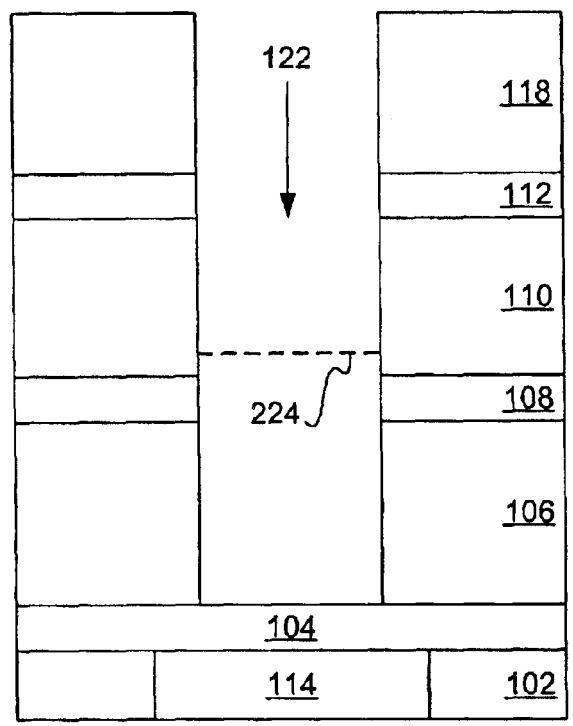
Figure 2A:
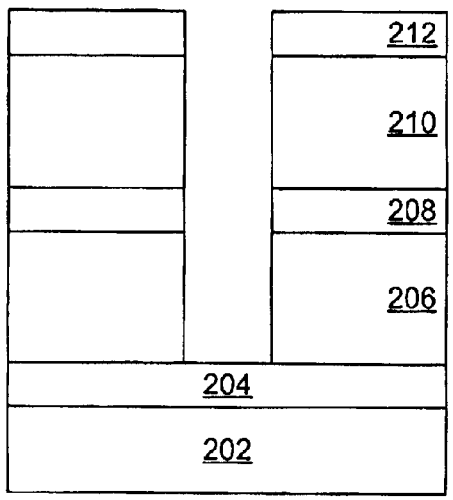
FIGS. 2A–2G are diagrams showing use of a non-photosensitive photoresist plug according to an embodiment of the invention, which can be used during damascene, dual-damascene, and other semiconductor fabrication processing.

In FIG. 2A, there are, in order from bottom to top, a metal layer 202, a first stop layer 204, a first dielectric layer 206, a second stop layer 208, a second dielectric layer 210, and a final layer 212. The metal layer 202 may be a copper layer, and alternatively may be situated with an inter-metallization dielectric layer (not shown in FIG. 2A). The stop layers 204 and 208 may be silicon nitride layers. A via hole 214 has been defined in the semiconductor wafer of FIG. 2A.

Figure 2B:
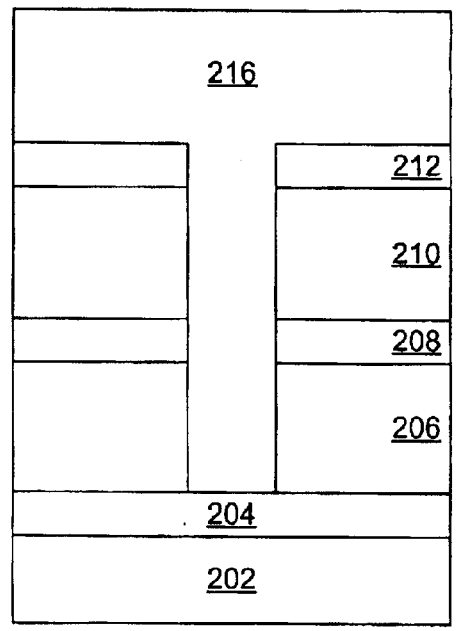

In FIG. 2B, non-photosensitive photoresist 216 coats the semiconductor wafer, filling the via hole 214. The non-photosensitive photoresist 216 can be negative photoresist. Generally, there are two types of photoresist: positive and negative. For positive resists, the resist is exposed with ultraviolet (UV) light wherever the underlying material is to be removed. In these resists, exposure to the UV light changes the chemical structure of the resist so that it becomes more soluble in the developer. The exposed resist is then washed away by the developer solution, leaving windows of the bare underlying material. The mask, therefore, contains an exact copy of the pattern that is to remain on the wafer.

Negative resists behave in just the opposite manner. Exposure to the UV light causes the negative resist to become polymerized, and more difficult to dissolve. Therefore, the negative resist remains on the surface wherever it is exposed, and the developer solution removes only the unexposed portions. Masks used for negative photoresists, therefore, contain the inverse of the pattern to be transferred. The photoresist 216 can also be any other type of non-deep UV light-sensitive photoresist.

Figure 2C:
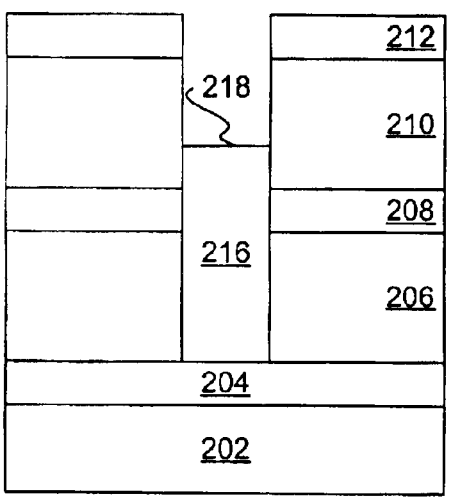
Figure 2D:
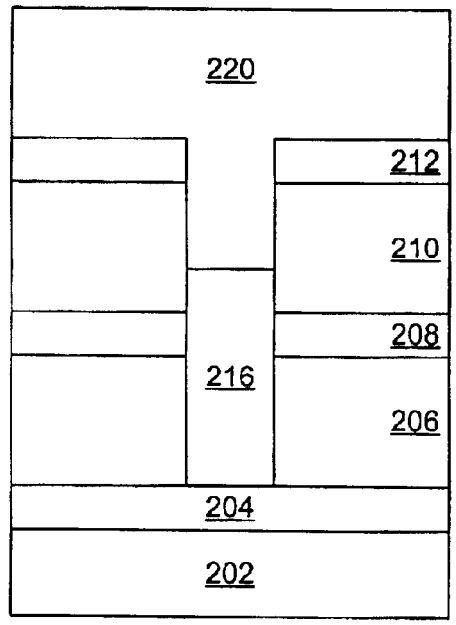

In FIG. 2C, the non-photosensitive photoresist 216 is etched back to the level 218. The etching back can be by reactive ion etching (RIE), or another type of etching. In FIG. 2D, deep UV light-sensitive photoresist 220 coats the semiconductor wafer, including the part of the via hole 214 from which the non-photosensitive photoresist 216 has been etched. The deep UV light-sensitive photoresist 220 can be 193 nanometer (nm) photoresist, 222 nm photoresist, 248 nm photoresist, or another type of photoresist, such as more generally positive photoresist. In FIG. 2D, the deep UV light-sensitive photoresist 220 is exposed to corresponding deep UV light, as indicated by the arrows 222, such as light having 193 nm wavelengths, 222 nm wavelengths, 248 nm wavelengths, and so on. The non-photosensitive photoresist 216 is not responsive to the deep UV light, however.

Figure 2E:
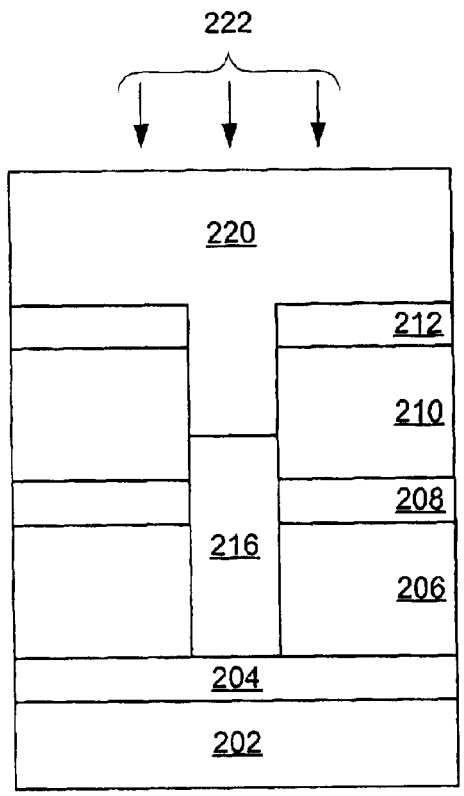
Figure 2F:
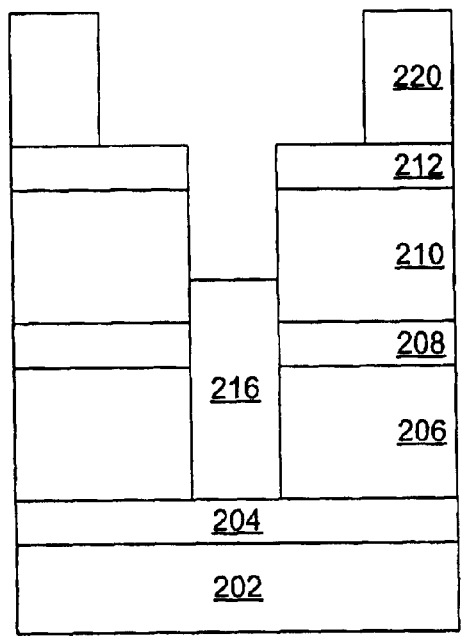
Figure 2G:
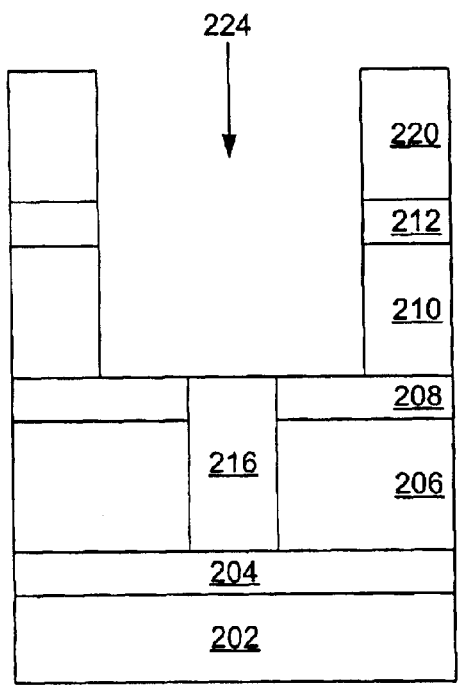

In FIG. 2E, the exposed deep UV light-sensitive photoresist 220 is selectively developed to remove most of the photoresist 220, including that which was in the via hole 214. The non-photosensitive photoresist 216, since it is not responsive to the deep UV light, is not affected by the development process, and thus is substantially not removed. That is, the non-photosensitive photoresist 216 substantially remains after development and removal of the deep UV light-sensitive photoresist 220. In FIG. 2F, a trench is formed between the parts of the deep UV light-sensitive photoresist 220 that remain, by an etching or other process. The presence of the non-photosensitive photoresist 216 in the via hole 214 substantially prevents formation of facets during trench formation. The remaining photoresist 220 can then be removed, which is not shown in FIG. 2F.

Figure 3:
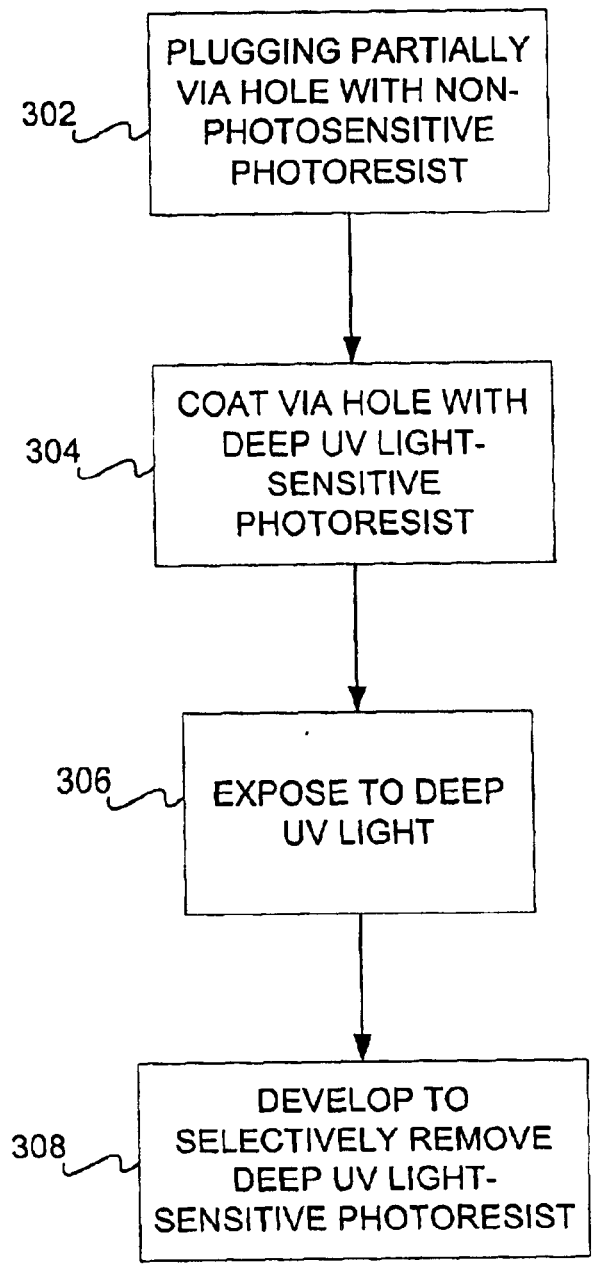
FIG. 3 is a flowchart of a method for using a non-photosensitive photoresist plug according to an embodiment of the invention.

FIG. 3 shows a method 300 according to an embodiment of the invention for use of a non-photosensitive photoresist plug for a via hole. The method 300 can be used in conjunction with a damascene, dual-damascene, or another type of semiconductor fabrication process. The method 300 summarizes the use of a non-photosensitive photoresist plug that has been described with reference to FIGS. 2A–2G. A semiconductor device according to an embodiment of the invention can be fabricated at least in part by performing the method 300.

First, a via hole of a semiconductor wafer is partially plugged with non-photosensitive photoresist (302). This photoresist may be a negative photoresist, a non-deep UV light-sensitive photoresist, or another type of photoresist. The performance of 302 is shown illustratively in FIGS. 2B and 2C that have been described. Next, the via hole is coated with deep UV light-sensitive photoresist, such as 193, 222, or 248 nm photoresist (304), which is shown illustratively in FIG. 2D.

The semiconductor wafer is then exposed to deep UV light (306), such as 193, 222, or 248 nm wavelength light. The exposure affects the deep UV light-sensitive photoresist, but does not affect the non-photosensitive photoresist. The exposure in 306 is shown illustratively in FIG. 2E. Finally, the semiconductor wafer is developed to selectively remove the deep UV light-sensitive photoresist (308), as shown illustratively in FIG. 2F. The non-photosensitive photoresist substantially remains, because the deep UV light did not affect it. The substantial remaining of the non-photosensitive photoresist substantially prevents facet formation.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:

plugging partially a via hole of a semiconductor wafer with non-deep ultraviolet (UV) light-sensitive photoresist;

coating the via hole and the semiconductor wafer with a deep UV light-sensitive photoresist;

exposing the semiconductor wafer to deep UV light, where the non-deep UV light-sensitive photoresist is unresponsive to the deep UV light; and, developing the semiconductor wafer to selectively remove the deep UV light-sensitive photoresist, where the non-deep UV light-sensitive photoresist substantially remains.

2. The method of claim 1, wherein the non-deep UV light-sensitive photoresist is negative photoresist.

3. The method of claim 1, wherein the deep UV light is 193 nanometer (nm) wavelength light, such that the deep UV light-sensitive photoresist is 193 nm photoresist.

4. The method of claim 1, wherein the deep UV light is 248 nanometer (nm) wavelength light, such that the deep UV light-sensitive photoresist is 248 nm photoresist.

5. The method of claim 1, wherein the deep UV light is 222 nanometer(nm) wavelength light, such that the deep UV light-sensitive photoresist is 222 nm photoresist.

6. The method of claim 1, wherein the non-deep UV light-sensitive photoresist substantially remaining substantially prevents facet formation.

7. The method of claim 1, wherein the plugging, the coating, the exposing, and the developing are part of a damascene process.

8. The method or claim 1, wherein the plugging, the coating, the exposing, and the developing are part of a dual-damascene process.

* * * * *